(12) United States Patent
Goyette et al.

(10) Patent No.: US 6,661,306 B2
(45) Date of Patent: Dec. 9, 2003

(54) COMPACT LUMPED ELEMENT DUAL HIGHPASS/LOWPASS BALUN LAYOUT

(75) Inventors: William R. Goyette, San Marcos, CA (US); Karl D. Peterschmidt, Carlsbad, CA (US); Trung H. Lam, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/114,700

(22) Filed: Apr. 2, 2002

(65) Prior Publication Data

US 2003/0184403 A1 Oct. 2, 2003

(51) Int. Cl.[7] .................................................. H03H 7/42
(52) U.S. Cl. .............................. 333/25; 333/26; 333/33; 336/232; 336/233
(58) Field of Search .......................... 333/25, 26, 32, 333/33; 336/200, 232, 233

(56) References Cited

U.S. PATENT DOCUMENTS 6,396,362 B1 * 5/2002 Mourant et al. .............. 333/25
6,424,227 B1 * 7/2002 El-Sharawy ................ 330/307

OTHER PUBLICATIONS

Chiou, Hwann–Kaeo and Lin, Hao–Hsiung, "A Miniature MMIC Double Doubly Balanced Mixer Using Lumped Dual Balun for High Dynamic Receiver Application", IEEE Microwave and Guided Wave Letters, vol. 7, No. 8, Aug. 1997, pps. 227–228.

Chiou, Hwann–Kaeo, Juant, Yu–Ru and Lin, Hao–Hsiung, "Miniature MMIC Star Double Balanced Mixer Using Lumped Dual Balun", Electronics Letters, vol. 33, No. 6, Mar. 13, 1997, pps. 503–505.

Sturdivant, Rick, "Balun Designs for Wireless, . . . Misers, Amplifiers and Antennas", Applied Microwave, Summer 1993, pps. 34–44.

Hirota, Tetsuo and Muraguchi, Masahiro, "K–Band Frequency Up–Converters Using Reduced–Size Couplers and Dividers", IEEE, 1991, pps. 53–56.

Parisi, Samuel J., "180° Lumped Element Hybrid", IEEE MTT–S Digest, 1989, pps. 1243–1246.

* cited by examiner

Primary Examiner—Kenneth B. Wells
(74) Attorney, Agent, or Firm—John A. Miller; Warn, Burgess & Hoffmann, P.C.

(57) ABSTRACT

A circuit layout for a lumped element dual-balun (248) where the elements of the dual-balun (248) are patterned on a monolithic substrate (250) in a compact design. The dual-balun (248) includes four inductors (252, 254, 256, 258) and four capacitors (340, 342, 360, 388) electrically coupled together to provide two zero phase RF output signals and two 180° phase RF output signals. The inductors (252, 254, 256, 258) are symmetrically disposed in a rectangular area on the substrate (250). A first pair of the inductors (252, 254) is positioned at one end of the rectangular area, and a second pair of the inductors (256, 258) is positioned at an opposite end of the rectangular area. The capacitors (340, 342, 360, 388) are formed on the monolithic substrate (250) in a central circuit area (260) between the first pair (252, 254) and the second pair of inductors (256, 258). RF output lines (350, 354, 372, 390) are coupled to circuit elements in the circuit area (260) and extend out of the circuit area (260) between the first a pair and the second pair of the inductors (252, 254, 256, 258).

19 Claims, 4 Drawing Sheets

US 6,661,306 B2

COMPACT LUMPED ELEMENT DUAL HIGHPASS/LOWPASS BALUN LAYOUT

BACKGROUND OF THE INVENTION

1. Field of the Invention

This invention relates generally to a lumped element dual-balun and, more particularly, to a circuit layout for a lumped element dual-balun for a star mixer or a double doubly balanced mixer, where the balun elements are configured on a monolithic substrate so that capacitive elements are disposed in a channel area defined between symmetrically disposed inductive elements.

2. Discussion of the Related Art

Modern communications systems employ transmitter and receiver designs that attempt to maximize the utilization of the assigned frequency bandwidth associated with the various communications channels because signal bandwidth is a costly investment for the system provider. Maximizing the utilization of the assigned bandwidth translates to providing transmitters and receivers that have extremely high performance. However, the transmitters and receivers must also be low cost. The radio frequency (RF) components in a communications system typically are the highest cost items because they are usually custom designed elements and are not mass produced.

One RF component that falls into this category is a frequency mixer. A frequency mixer mixes two RF or intermediated frequency (IF) signals to create a sum and difference frequency for frequency down-conversion or frequency up-conversion purposes. For example, the signal received in the receiver is mixed with a local oscillator (LO) signal to generate an IF signal suitable for subsequent signal processing. Typically, mixers are critical for setting the performance of the RF signal chain. Thus, mixers with lower intermodulation products and high dynamic range that can be implemented as a cell in an RF integrated circuit (IC) are needed.

One known mixer employed in RF communications systems of the type being discussed herein is referred to in the art as a ring mixer. A ring mixer employs four diodes connected in a ring configuration that mix the RF signal and the LO signal to generate the IF signal. The ring mixer employs a hybrid or balun that splits the RF signal and the LO signal into signals that are 180° out of phase with each other. A ring mixer balun is disclosed in Sturdivant, Rick, "Balun Designs for Wireless, . . . Mixers, Amplifiers and Antennas," Applied Microwave, Summer 1993, pps. 34–44. The split RF signals and the LO signals are applied to the mixer between the diodes at opposite corners of the ring. The diodes are switched on and off in response to the positive and negative portions of the RF signals to provide modulation. The IF signal is generated between the diodes at the other opposite corners of the ring.

FIG. 1 is a schematic diagram of a known lumped element ring balun circuit 10. The ring balun circuit 10 includes an electrical ring 12 having four sides defining corner nodes 14, 16, 18 and 20. The ring balun circuit 10 includes an electrical configuration of capacitors $C_1$–$C_6$, inductors $L_1$–$L_4$ and a resistor $R_1$. Each side of the ring 12 includes a capacitor and an inductor that combine to provide a high pass filter that forms a lumped element transmission line that causes a delay of a signal propagating therethrough. As is known in the art, current leads voltage on a capacitor, and voltage leads current on an inductor. Therefore, a series capacitor and shunt inductor provide a phase lead of the signal, and a series inductor and a shunt capacitor provide a phase lag of the signal.

An RF input signal is applied to the node 14, and the filters provide an RF signal at the node 20 that is 90° out of phase with the signal at the node 14, an RF signal at the node 18 that is 180° out of phase with the signal at the node 14, and an RF signal at the node 16 that is 270° out of phase with the signal at the node 14. Output lines 54 and 56 are coupled to the nodes 20 and 16, respectively, to provide output signals that are 180° out of phase with each other. DC blocking capacitors 24 and 26 are provided in the output lines 54 and 56 to prevent DC signals from the mixer from entering the ring balun circuit 10.

The ring balun circuit 10 is applicable for a ring mixer, but is limited in use for other types of mixers, such as star mixers and double doubly balanced mixers, because of the complexities in providing a dual balun in the ring design. Therefore, other balun designs are employed in the art for other types of mixers. FIG. 2 is a schematic diagram of a lumped element dual-balun circuit 30 including a first balun 32 and a second balun 34 that has particular application for use in combination with a star mixer or a monolithic microwave integrated circuit (MMIC) double doubly balanced mixer (DDBM). The dual-balun circuit 30 receives an RF input signal, and the first balun 32 outputs two signals that are 180° out of phase with each other and the second balun 34 outputs two RF signals that are 180° out of phase with each other. A dual-balun structure of this type is disclosed in Chiou, Hwann-Keo, et al., "Miniature MMIC Star Double Balanced Mixer Using Lumped Dual Balun," Electronics Letters, Vol. 33, No. 6, Mar. 13, 1997, pps. 503–505, and Chiou, Hwann-Keo, et al., "A Miniature MMIC Double Doubly Balanced Mixer Using Lumped Dual Balun for High Dynamic Receiver Application," IEEE, Microwave and Guided Wave Letters, Vol. 7, No. 8, August 1997, pps. 227–229.

The dual-balun circuit 30 employs inductor and capacitor filter networks in the same manner as the balun circuit 10 discussed above to provide the RF signals that are 180° out of phase with each other. The balun 32 includes a filter made up of inductor $L_1$ and capacitor $C_1$ and a filter made up of inductor $L_2$ and capacitor $C_2$. Likewise, the balun 34 includes a filter made up of inductor $L_3$ and capacitor $C_3$ and a filter made up of inductor $L_4$ and capacitor $C_4$. In the balun 32, the inductor $L_1$ is coupled to the capacitor $C_1$ at node 36, the inductor $L_1$ is coupled to the capacitor $C_2$ at node 38, the capacitor $C_2$ is coupled to the inductor $L_2$ at node 40, and the inductor $L_2$ is coupled to the capacitor $C_1$ at node 42. In the balun 34, the inductor $L_3$ is coupled to the capacitor $C_3$ at node 44, the inductor $L_3$ is coupled to the capacitor $C_4$ at node 46, the capacitor $C_4$ is coupled to the inductor $L_4$ at node 48, and the inductor $L_4$ is coupled to the inductor $C_3$ at node 50. The RF input signal is applied to the nodes 36 and 44. An RF output signal that is in phase with the RF input signal is provided at the nodes 42 and 50, and an RF output signal that is 180° out of phase with the RF input signal is provided at the nodes 38 and 46.

SUMMARY OF THE INVENTION

In accordance with the teachings of the present invention, a circuit layout for a lumped element dual-balun is disclosed where the elements of the dual-balun are patterned on a monolithic substrate in a compact design. The dual-balun includes four inductors and four capacitors electrically coupled together to filter and delay an RF input signal to provide two zero phase RF output signals and two 180° phase RF output signals. The inductors are symmetrically disposed in a rectangular area on the substrate. A first pair of the inductors is positioned at one end of the rectangular area, where the inductors are adjacent to each other, and a second pair of the inductors is positioned at an opposite end of the rectangular area, where the inductors are adjacent to each other. All of the capacitors are formed on the substrate in a central circuit area between the first pair of inductors and the second pair of inductors.

The design employs metallized traces patterned on the substrate to provide electrical coupling between the inductors and the capacitors. Each inductor includes a winding having an inner end and an outer end that are electrically coupled to circuit elements in the circuit area. The inner end of each winding is coupled to a trace that extends under the winding through an air bridge to be electrically isolated thereform. The four RF output lines are coupled to circuit elements at a central location of the circuit area and extend out of the circuit area between the first pair of inductors and the second pair of the inductors in a parallel manner.

Additional objects, advantages and features of the present invention will become apparent from the following description and appended claims, taken in conjunction with the accompanying drawings.

DETAILED DESCRIPTION OF THE EMBODIMENTS

The following discussion of the invention directed to a specialized circuit layout for a balun on a monolithic substrate is merely exemplary in nature, and is in no way intended to limit the invention or its applications or uses.

The present invention proposes an arrangement of the inductive and capacitive elements of the balun circuit 10 and the dual-balun circuit 30 on a monolithic substrate that conserves space, reduces parasitic capacitances and inductances, uses less power and is low cost. The balun circuit 10 is intended to be used in connection with a ring mixer and the dual-balun circuit 30 is intended to be used in connection with a star mixer or a DDBM. However, this is by way of a non-limiting example in that the balun configuration of the invention discussed below will have application to other systems including other mixers, amplifiers, antennas, etc. Further, the present invention can be configured to provide other phase shifts in signals other than 180° phase shifts. Also, the layout design can be employed in other types of circuits, such as integrated circuits on an integrated circuit board.

Figure 1:
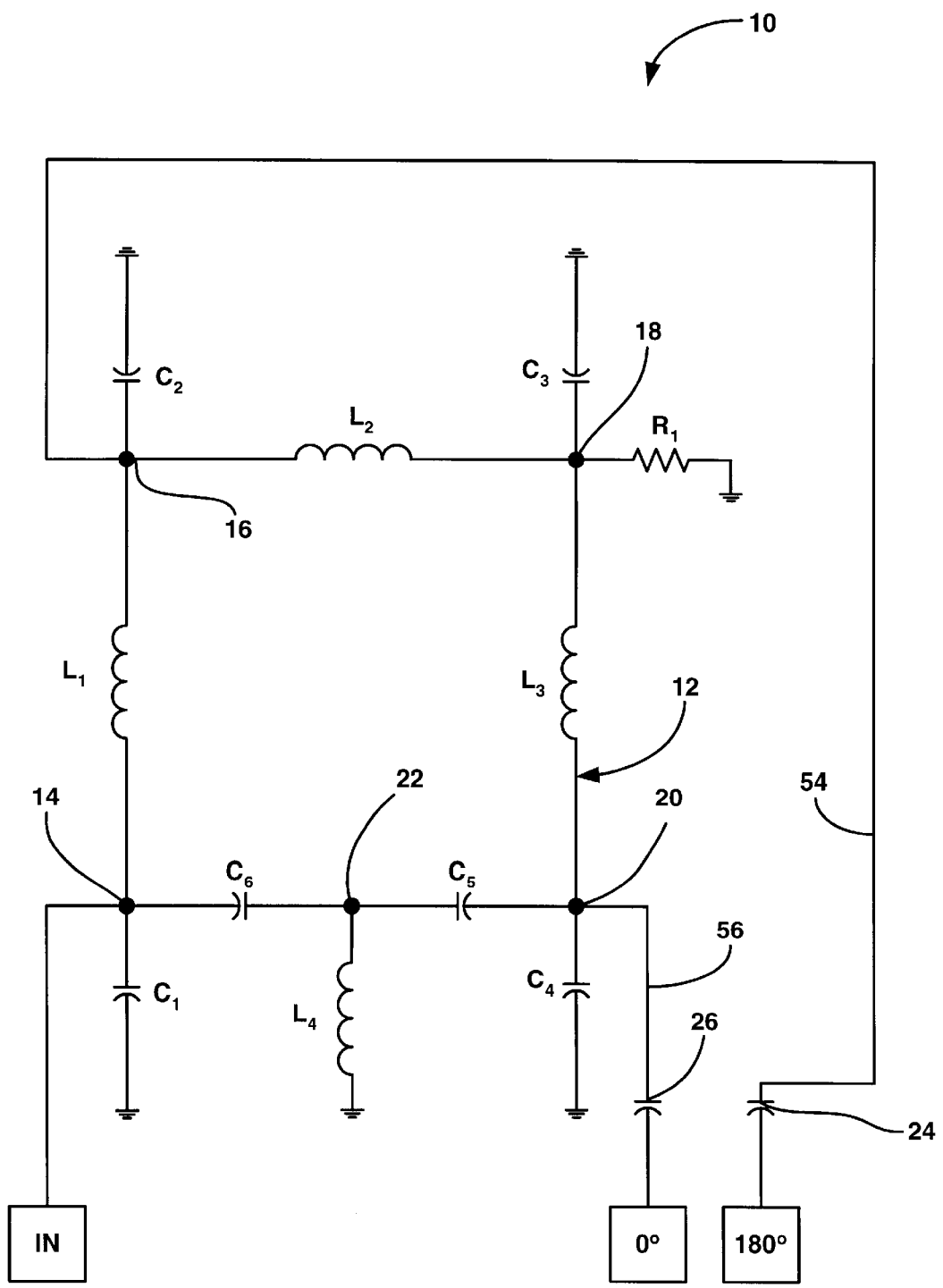
FIG. 1 is a schematic diagram of a known ring balun for a ring mixer.
Figure 3:
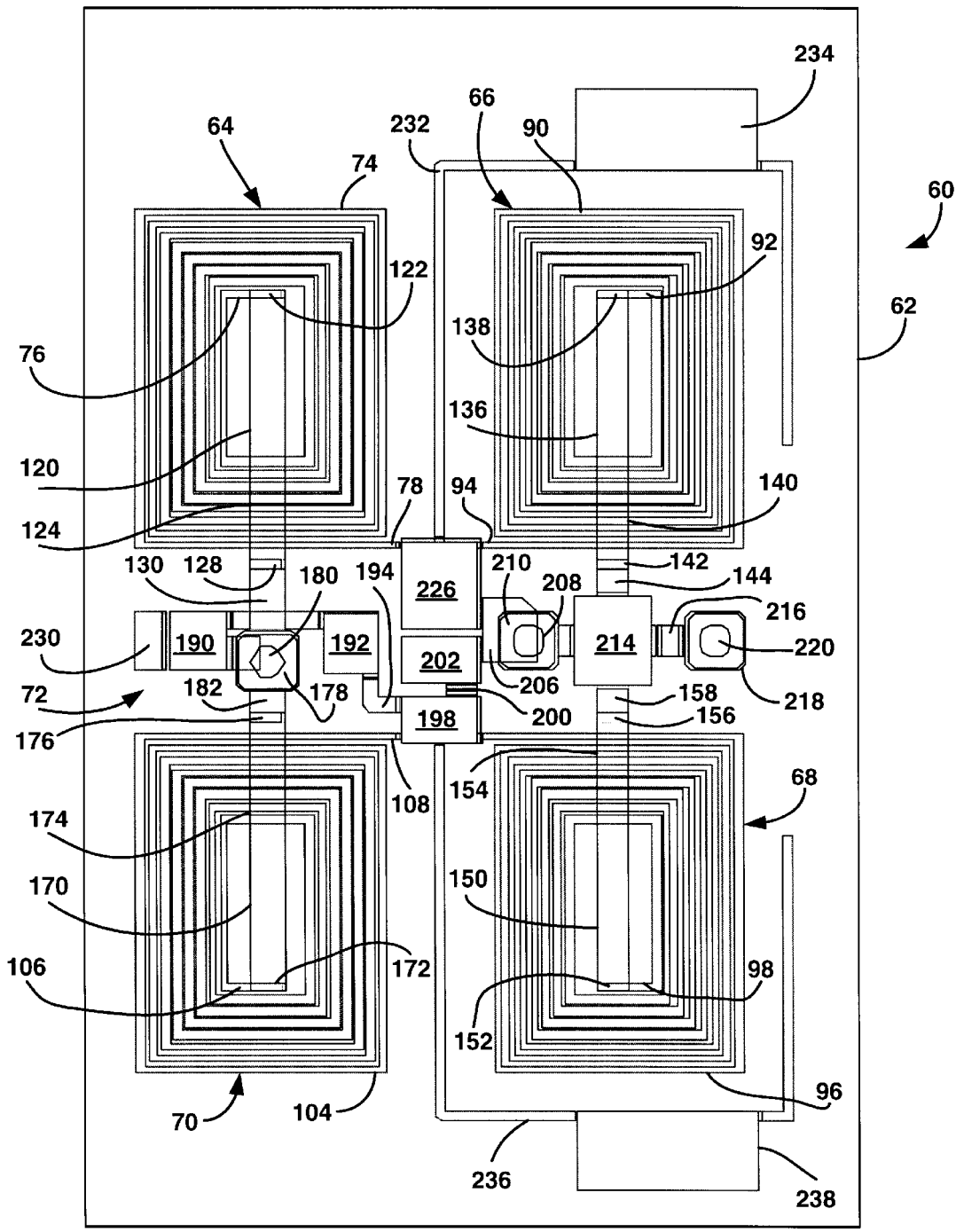
FIG. 3 is a top view of a layout on a monolithic substrate for the elements of a ring balun of the type shown in FIG. 1, according to an embodiment of the present invention.

FIG. 3 is a top view of a circuit layout for a ring balun 60 that includes the same electrical elements as the balun circuit 10 discussed above. The electrical elements are patterned on a monolithic substrate 62, such as an MMIC, by any suitable metalization and deposition process that provides conductive and dielectric areas to define the elements. The substrate 62 can be any suitable material, such as InP, GaAs, sapphire, etc. Rectangular areas in the traces and metalized regions discussed below represent vertically extending or overlapping metal areas to provide the electrical coupling. Many techniques are known for patterning inductors as metallized traces or windings on a monolithic substrate and for patterning capacitors as metallized patches having opposing plates and a dielectric formed therebetween. The invention goes to the orientation of the inductors and capacitors on the substrate 62. In this regard, the various electrical elements of the balun 60 will be discussed with reference to the schematic representation of those elements as shown in FIG. 1.

The balun 60 includes symmetrically disposed inductors including a first inductor 64, representing the inductor $L_1$, a second inductor 66, representing the inductor $L_2$, a third inductor 68, representing the inductor $L_3$, and a fourth inductor 70, representing the inductor $L_4$. As will be discussed below, the various capacitors $C_1$–$C_6$ and the interconnection between the capacitors $C_1$–$C_6$ and the inductors $L_1$–$L_4$ are provided in a central circuit area 72 defined between the pair of the inductors 64 and 66 and the pair of the inductors 68 and 70. By symmetrically disposing the inductors 64–70 on the substrate 62 in this manner, and confining the other circuit elements to a central location therebetween, significant advantages are provided for limiting the space requirements of the balun 60.

The inductor 64 includes a metallized trace defining a winding 74 having an inner end 76 and an outer end 78. The inductor 66 includes a metallized trace defining a winding 90 having an inner end 92 and an outer end 94. The inductor 68 includes a metallized trace defining a winding 96 having an inner end 98 and an outer end 100. The inductor 70 includes a metallized trace defining a winding 104 having an inner end 106 and an outer end 108. Although the inductors 64–70 are shown in a rectangular orientation, other designs consistent with the scope of the present invention can include other shapes, including hexagonal, circular, elliptical, etc.

Each of the inner ends 76, 92, 98 and 106 is electrically coupled to circuit elements in the circuit area 72. To provide this electrical coupling with the necessary electrical isolation, an air bridge is formed beneath a portion of the windings 74, 90, 96 and 104. The airbridges are formed by a raised portion of the winding so that the winding does not electrically connect with the trace and has minimal electrical coupling thereto. An interconnect via as discussed herein is a metallized region for electrically connecting two traces, or an overlap region of two traces.

The end 76 of the winding 74 is electrically coupled to a metal trace 120 by an interconnect via 122. The trace 120 extends through an air bridge 124 formed by the winding 74 to be electrically isolated therefrom, and is coupled to a metallized region 130 by an interconnect via 128, where the region 130 defines the node 14. The end 92 of the winding 90 is electrically coupled to a metal trace 136 by an interconnect via 138. The trace 136 extends through an air bridge 140 formed by the winding 90 to be electrically isolated therefrom, and is coupled to a metallized region 144 by an interconnect via 142, where the region 144 defines the node 18. The end 98 of the winding 96 is electrically coupled to a metal trace 150 by an interconnect via 152. The trace 150 extends through an air bridge 154 formed by the winding 96 to be electrically isolated therefrom, and is coupled to a metallized region 158 by an interconnect via 156, where the region 158 also represents the node 18. The end 106 of the winding 104 is electrically coupled to a metal trace 170 by an interconnect via 172. The trace 170 extends through an air bridge 174 formed by the winding 104 to be electrically isolated therefrom, and is coupled to a metallized region 182 by a via 176.

A top plate of a capacitor 190, representing the capacitor $C_1$, is electrically coupled to the metallized region 130, and a bottom plate of the capacitor 190 is coupled to a ground via 180. The via 180 extends through the substrate 62 and is electrically coupled to a metallized ground plane (not shown) on an opposite surface of the substrate 62. The via 180 is electrically coupled to a metallized region 178 that acts as a ground patch on the top surface of the monolithic substrate 62. The metallized region 178 is electrically coupled to the metallized region 182 so that the end 106 of the winding 104 is coupled to ground.

A top plate of a capacitor 192, representing the capacitor $C_6$, is electrically coupled to the metallized region 130 so that the inductor 64 and the capacitor 192 are electrically coupled. A bottom plate of the capacitor 192 is electrically coupled to a metallized region 194 representing the node 22. A top plate of a capacitor 198, representing the capacitor $C_5$, is electrically coupled to the metallized region 194 and is electrically coupled to the end 108 of the winding 104. A bottom plate of the capacitor 198 is electrically coupled to the end 100 of the winding 96 and is electrically coupled to a metallized region 200, representing the node 20. A top plate of a capacitor 202, representing the capacitor $C_4$, is electrically coupled to the metallized region 200, and a bottom plate of the capacitor 202 is electrically coupled to a metallized region 206. A bottom plate of a capacitor 226, representing the capacitor $C_2$, is also electrically coupled to the metallized region 206. A top plate of the capacitor 226 is electrically coupled to the end 78 of the winding 74 and the end 94 of the winding 90. This connection point represents the node 16.

A metallized region 210 on a top surface of the monolithic substrate 62 is electrically coupled to a ground via 208 that is electrically coupled to the ground plane. The metallized region 206 is also electrically coupled to the via 208. A bottom plate of a capacitor 214, representing the capacitor $C_3$, is electrically coupled to the metallized region 210. A top plate of the capacitor 214 is electrically coupled to the metallized regions 144 and 158 to couple the inductors 66 and 68 to the capacitor 214. The top plate of the capacitor 214 is also coupled to a metallized region 216, representing the resistor $R_1$. The metallized region 216 is also coupled to a metallized region 218 that is electrically coupled to a ground via 220. The via 220 extends through the monolithic substrate 62 and is electrically coupled to the ground plane.

The RF input signal, applied to the node 14, is applied to a metallized region 230. The metallized region 230 is electrically coupled to the top plate of the capacitor 190. A 180° phase output trace 232 is electrically coupled to the top plate of the capacitor 226, and extends between the inductors 64 and 66, as shown. A DC blocking capacitor 234, representing the capacitor 24, is coupled to the output trace 232. A zero phase output trace 236 is electrically coupled to the top plate of the capacitor 198, and extends between the inductors 68 and 70, as shown. A DC blocking capacitor 238 is coupled to the output trace 236.

Figure 2:
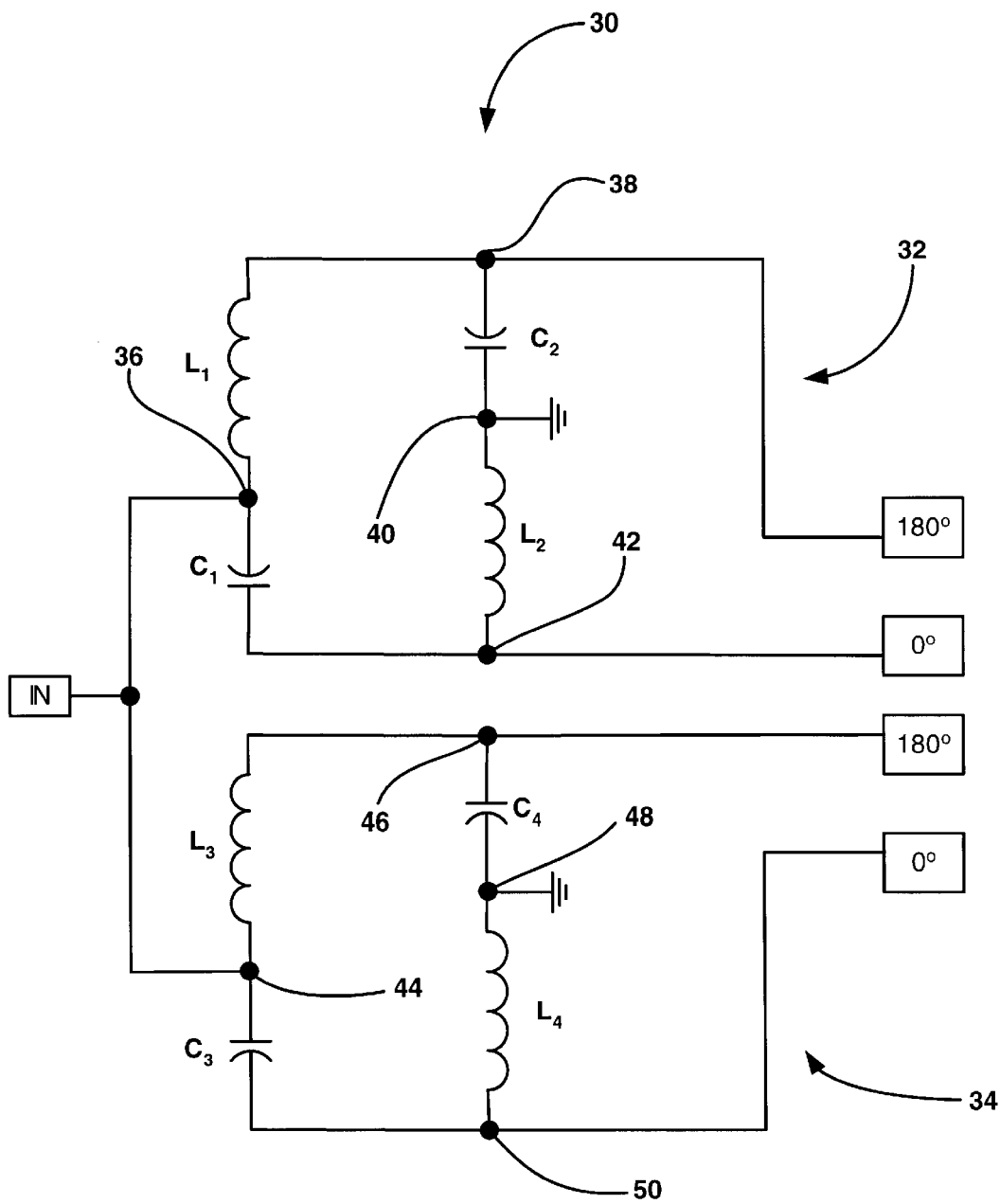
FIG. 2 is a schematic diagram of a known dual-balun for a star mixer or a double doubly balanced mixer.
Figure 4:
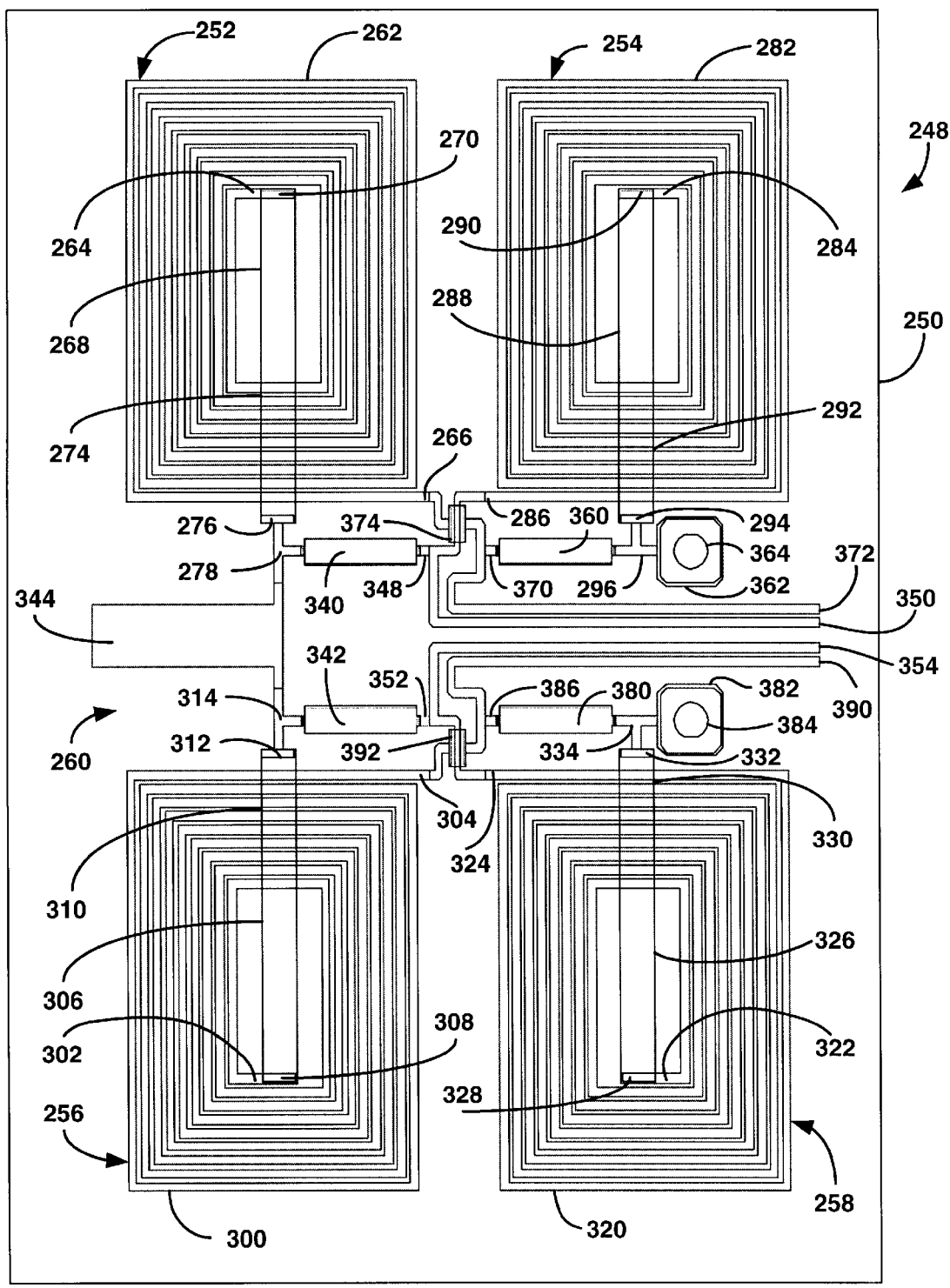
FIG. 4 is a top view of a layout on a monolithic substrate for the elements of a dual-balun of the type shown in FIG. 2, according to another embodiment of the present invention.

FIG. 4 is a top view of a circuit layout for a dual-balun 248 that includes the same elements as the dual-balun circuit 30 shown in FIG. 2. The elements of the dual-balun 248 are formed on a monolithic substrate 250. The dual-balun 248 includes a first inductor 252, representing the inductor $L_1$, a second inductor 254, representing the inductor $L_2$, a third inductor 256, representing the inductor $L_3$, and a fourth inductor 258, representing the inductor $L_4$. As will be discussed below, the various capacitors $C_1$–$C_4$ and the interconnection between the capacitors $C_1$–$C_4$ and the inductors $L_1$–$L_4$ are provided in a central circuit area 260 defined between the pair of the inductors 252 and 254 and the pair of the inductors 256 and 258.

The inductor 252 includes a metallized trace defining a winding 262 having an inner end 264 and an outer end 266. The inner end 264 is electrically coupled to a metal trace 268 by an interconnect via 270. The trace 268 extends through an air bridge 274 formed by the winding 262 and is electrically coupled to an interconnect via 276. The via 276 is electrically coupled to a metallized region 278 that represents the node 36.

The inductor 254 includes a metallized trace defining a winding 282 having an inner end 284 and an outer end 286. The inner end 284 is electrically coupled to a metal trace, 288 by an interconnect via 290. The trace 288 extends through an air bridge 292 formed by the winding 282 and is electrically coupled to an interconnect via 294. The via 294 is electrically coupled to a metallized region 296 that represents the node 40.

The inductor 256 includes a metallized trace defining a winding 300 having an inner end 302 and an outer end 304. The inner end 302 is electrically coupled to a metal trace 306 by an interconnect via 308. The trace 306 extends through an air bridge 310 formed by the winding 300 and is electrically coupled to an interconnect via 312. The via 312 is electrically coupled to a metallized region 314 that represents the node 44.

The inductor 258 includes a metallized trace defining a winding 320 having an inner end 322 and an outer end 324. The inner end 322 is electrically coupled to a metal trace 326 by an interconnect via 328. The trace 326 extends through an air bridge 330 formed by the winding 320 and is electrically coupled to an interconnect via 332. The via 332 is electrically coupled to a metallized region 334 that represents the node 48.

A top plate of a capacitor 340, representing the capacitor $C_1$, is electrically coupled to the metallized region 278 so that the capacitor 340 is electrically coupled to the inductor 252. Likewise, a top plate of a capacitor 342 is electrically coupled to the metallized region 314 so that the capacitor 342 is electrically coupled to the inductor 256. A metallized region 344 is coupled to the metallized regions 278 and 314, and represents an input port for receiving the input RF signal. Thus, the input RF signal is applied to the capacitors 340 and 342 and the inductors 252 and 256 in the same manner as the input signal for the dual-balun circuit 30.

A bottom plate of the capacitor 340 is electrically coupled to a metallized region 348, representing the node 42, that is electrically coupled to a zero phase output line 350. The outer end 286 of the winding 282 is also coupled to the output line 350. Likewise, a bottom plate of the capacitor 342 is electrically coupled to a metallized region 352, representing the node 50, that is electrically coupled to a zero phase output line 354. The outer end 324 of the winding 320 is also coupled to the output line 354.

A bottom plate of a capacitor 360, representing the capacitor $C_2$, is electrically coupled to the metallized region 296. The metallized region 296 is electrically coupled to a metallized region 362 that is electrically coupled to a ground via 364. The ground via 364 extends through the substrate 250 and is electrically coupled to a ground plane (not shown) on an opposite surface of the substrate 250. Therefore, the inductor 254 and the capacitor 360 are electrically coupled to ground. A top plate of the capacitor 360 is electrically coupled to a metallized region 370. The end 266 of the winding 262 and the metallized region 370 are electrically coupled to a 180° phase output trace 372 so that the inductor 254 and the capacitor 360 are coupled thereto. A dielectric region 374 electrically isolates the output traces 350 and 372.

A bottom plate of a capacitor 380, representing the capacitor $C_4$, is electrically coupled to the metallized region 334. The metallized region 334 is electrically coupled to a metallized region 382 that is electrically coupled to a ground via 384. The ground via 384 is electrically coupled to the ground plane so that the inductor 258 and the capacitor 380 are coupled to ground. A top plate of the capacitor 380 is electrically coupled to a metallized region 386. The end 304 of the winding 300 and the metallized region 386 are electrically coupled to a 180° phase output line 390 so that the inductor 256 and the capacitor 380 are coupled thereto. A dielectric region 392 isolates the output traces 354 and 390.

The symmetrical design of the dual-balun 248 allows the output traces 350, 354, 372 and 390 to extend parallel to each other through the circuit area 260 between the inductors 254 and 258. This design provides significant advantages for balun performance in a compact design. Further, by minimizing the size and length of the various metallized regions that couple circuit elements to the capacitors, parasitic inductances on the capacitors are minimized.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A dual-balun formed on a substrate, said dual-balun comprising:

four inductors symmetrically disposed in a rectangular area on the substrate, each inductor including an electrical winding having a first end and a second end, wherein a first inductor and a second inductor are positioned adjacent to each other at one side of the rectangular area and a third inductor and a fourth inductor are positioned adjacent to each other at an opposite side of the rectangular area so that a circuit area including circuit elements is defined between the pair of the first and second inductors and the pair of the third and fourth inductors in a central portion of the rectangular area; and a first output trace electrically coupled to the first end of the first inductor in the circuit area, a second output trace electrically coupled to the first end of the second inductor in the circuit area, a third output trace electrically coupled to the first end of the third inductor in the circuit area and a fourth output trace electrically coupled to the first end of the fourth inductor in the circuit area, wherein the first, second, third and fourth output traces extend through the circuit area between the second and fourth inductors, and wherein an output signal on the first output trace is out of phase with an output signal on the second output trace and an output signal on the third output trace is out of phase with an output signal on the fourth output trace.

2. The dual-balun according to claim 1 wherein the first end of each winding is an outer end of the winding and the second end of each winding is an inner end of the winding.

3. The dual-balun according to claim 2 wherein the inner end of each winding is-electrically coupled to a circuit element in the circuit area by an air bridge formed by parallel portions of the winding of the inductor.

4. The dual-balun according to claim 2 wherein the inner end of each winding is electrically coupled to a capacitor in the circuit area.

5. The dual-balun according to claim 2 wherein the inner ends of the windings of the first and third inductors are coupled to an RF input metallized region, and the inner ends of the windings of the second and fourth inductors are coupled to a ground via.

6. The dual-balun according to claim 1 wherein the circuit elements include a plurality of capacitors in the circuit area, wherein the inductors and the capacitors are electrically coupled together to define the lumped element dual-balun.

7. The dual-balun according to claim 6 wherein the plurality of capacitors is four capacitors.

8. The dual-balun according to claim 1 wherein the circuit elements are selected from the group consisting of ground vias and capacitors.

9. The dual-balun according to claim 6 wherein at least one of the capacitors includes three plates.

10. The dual-balun according to claim 1 wherein the dual-balun is a lumped element star mixer balun.

11. A dual-balun for providing two zero phase RF output signals and two 180° phase RF output signals, said dual-balun comprising:

a monolithic substrate;

four inductors symmetrically disposed on the substrate, each inductor including an electrical winding having an inner end and an outer end, wherein the inductors include a pair of a first inductor and a second inductor where the first and second inductors are positioned adjacent to each other and a pair of a third inductor and a fourth inductor where the third and fourth inductors are positioned adjacent to each other, wherein a circuit area is defined between the pair of the first and second inductors and the pair of the third and fourth inductors; and four capacitors disposed in the circuit area, wherein the inner end of each winding is electrically coupled to a capacitor in the circuit area by an air bridge formed by parallel portions of the winding of the inductor, and wherein the inner end of the first end inductor is electrically coupled to a first capacitor, the inner end of the second inductor is electrically coupled to a second capacitor, the inner end of the third inductor is electrically coupled to a third capacitor and the inner end of the fourth inductor is electrically coupled to a fourth capacitor.

12. The dual-balun according to claim 11 further comprising a first output trace electrically coupled to the outer end of the winding of the first inductor in the circuit area, a second output trace electrically coupled to the outer end of the winding of the second inductor in the circuit area, a third output trace electrically coupled to the outer end of the winding of the third inductor in the circuit area and a fourth output trace electrically coupled to the outer end of the winding of the fourth inductor in the circuit area, and wherein an output signal on the first output trace is 180° out of phase with an output signal on the second output trace and an output signal on the third output trace is 180° out of phase with an output signal on the fourth output trace.

13. The dual-balun according to claim 12 wherein the first, second, third and fourth output traces are parallel to each other and extend through the circuit area between the second and fourth inductors.

14. The dual-balun according to claim 11 wherein the inner ends of the windings of the first and third inductors are coupled to an RF input metallized region, and the inner ends of the windings of the second and fourth inductors are coupled to a ground via.

15. The dual-balun according to claim 11 wherein at least one of the capacitors includes three plates.

16. The dual-balun according to claim 11 wherein the dual-balun is a lumped element star mixer balun.

17. A dual-balun for providing two zero phase RF output signals and two 180° phase RF output signals for a mixer, said dual-balun comprising:

a monolithic substrate;

four inductors symmetrically disposed on the substrate, each inductor including an electrical winding having an inner end and an outer end, wherein the inductors include a pair of a first inductor and a second inductor where the first and second inductors are positioned adjacent to each other and a pair of a third inductor and a fourth inductor, where the third and fourth inductors are positioned adjacent to each other, wherein a circuit area is defined between the pair of the first and second inductors and the pair of the third and fourth inductors;

four capacitors disposed in the circuit area, wherein the inner end of each winding is electrically coupled to a capacitor in the circuit area by an air bridge formed by parallel portions of the winding of the inductor; and a first output trace electrically coupled to the outer end of the winding first inductor in the circuit area, a second output trace electrically coupled to the outer end of the winding of the second inductor in the circuit area, a third output trace electrically coupled to the outer end of the winding of the third inductor in the circuit area and a fourth output trace electrically coupled to the outer end of the winding of the fourth inductor in the circuit area, and wherein an output signal on the first output trace is 180° out of phase with an output signal on the second output trace and an output signal on the third output trace is 180° out of phase with an output signal on the fourth output trace, and wherein the first, second, third and fourth output traces are parallel to each other and extend through the circuit area between the second and fourth inductors.

18. The dual-balun according to claim 17 wherein the mixer is selected from the group consisting of star mixers and double doubly balanced mixers.

19. The dual-balun according to claim 17 wherein the inner ends of the windings of the first and third inductors are coupled to an RF input metallized region, and the inner ends of the windings of the second and fourth inductors are coupled to a ground via.

* * * * *